United States Patent
Zhang et al.

(10) Patent No.: US 10,685,272 B2
(45) Date of Patent: Jun. 16, 2020

(54) OSCILLATION MAINTENANCE CIRCUIT WITH COMPARATOR-BASED PULSE GENERATION IN HALF-DUPLEX RFID TRANSPONDERS

(71) Applicant: EXCELIO TECHNOLOGY (SHENZHEN) CO., LTD., Shenzhen (CN)

(72) Inventors: Qianwen Zhang, Shenzhen (CN);
Patrick Bian Wu, Shenzhen (CN);
Fuqiang Han, Shenzhen (CN)

(73) Assignee: EXCELIO TECHNOLOGY (SHENZHEN) CO., LTD., Shenzhen (CN)

( * ) Notice: Subject to any disclaimer, the term of this patent is extended or adjusted under 35 U.S.C. 154(b) by 0 days.

(21) Appl. No.: 16/340,950

(22) PCT Filed: Oct. 10, 2017

(86) PCT No.: PCT/CN2017/105532
§ 371 (c)(1),
(2) Date: Apr. 10, 2019

(87) PCT Pub. No.: WO2018/068700
PCT Pub. Date: Apr. 19, 2018

(65) Prior Publication Data
US 2019/0236426 A1 Aug. 1, 2019

(30) Foreign Application Priority Data
Oct. 11, 2016 (CN) .......................... 2016 1 0888009

(51) Int. Cl.
*G06K 19/06* (2006.01)
*G06K 19/07* (2006.01)
(Continued)

(52) U.S. Cl.
CPC ..... *G06K 19/0726* (2013.01); *G06K 19/0723* (2013.01); *H03K 3/023* (2013.01); *H03K 3/0233* (2013.01)

(58) Field of Classification Search
CPC .......... G06K 19/0723; G06K 19/0726; H03K 3/0233
See application file for complete search history.

(56) References Cited

U.S. PATENT DOCUMENTS

| 7,667,548 B2 | 2/2010 | Meier |
| 10,387,691 B2 * | 8/2019 | Frederick ........... G06K 7/10009 |

(Continued)

FOREIGN PATENT DOCUMENTS

| CN | 103597502 A | 2/2014 |
| CN | 104506169 A | 4/2015 |
| CN | 106384144 A | 2/2017 |

OTHER PUBLICATIONS

The World Intellectual Property Organization (WIPO) International Search Report for PCT/CN2017/105532 dated Jan. 18, 2018 5 Pages (including translation).

*Primary Examiner* — Thien M Le
(74) *Attorney, Agent, or Firm* — Anova Law Group, PLLC

(57) ABSTRACT

An oscillation maintenance circuit with comparator-based pulse generation is provided. By sampling an RF signal and controlling a pulse generation circuit to generate a pulse signal of the same frequency as the RF signal, a switch unit is controlled to be ON/OFF at a same frequency as the RF signal, achieving synchronization between change of the current injection and the RF signal. Thus, the oscillation frequency is not affected by current injection, ensuring the FSK communication performance. At the same time, two comparators are respectively compared with two reference voltage levels to obtain an output pulse signal, and the (Continued)

reference voltage levels can be adjusted according to practical requirements, so that the switch-on point of time and current injection time duration are adjustable, maximizing the efficiency of current injection, resulting in simple circuit structure, low power consumption, and increased communication distance of an HDX passive RFID transponder.

10 Claims, 4 Drawing Sheets

(51) Int. Cl.
*H03K 3/0233* (2006.01)
*H03K 3/023* (2006.01)

(56) References Cited

U.S. PATENT DOCUMENTS

| | | | |
|---|---|---|---|
| 2009/0033411 A1* | 2/2009 | Meier | G06K 19/0723 |
| | | | 327/596 |
| 2009/0174592 A1 | 7/2009 | Muellner | |
| 2017/0012675 A1* | 1/2017 | Frederick | G06K 7/10009 |
| 2017/0095315 A1* | 4/2017 | van der Weide | A61B 90/39 |
| 2018/0042517 A1* | 2/2018 | van der Weide | A61B 5/0068 |
| 2019/0286966 A1* | 9/2019 | Zhang | G06K 19/0723 |

* cited by examiner

PM1

OSCILLATION MAINTENANCE CIRCUIT WITH COMPARATOR-BASED PULSE GENERATION IN HALF-DUPLEX RFID TRANSPONDERS

CROSS-REFERENCE TO RELATED APPLICATIONS

This application is a national stage entry of PCT Patent Application No. PCT/CN2017/105532, filed on Oct. 10, 2017, which claims priority to Chinese Patent Application No. 201610888009.X, filed on Oct. 11, 2016, contents of all of which are incorporated herein by reference in entirety.

FIELD

The present invention relates to the field of passive radio frequency identification (RFID) and, more specifically, to a half-duplex RFID oscillation maintenance circuit with comparator-based pulse generation, and a half-duplex passive RFID transponder including the oscillation maintenance circuit.

BACKGROUND

Half-duplex (HDX) radio frequency communication is a way of communication for a passive RFID transponder. In the communication process, information can be transmitted by an RFID reader to the transponder, referred to as downlink transmission, or by the transponder to the reader, referred to as uplink transmission. The HDX transmission is such a transmission mode in which uplink transmission and downlink transmission are not simultaneously performed. During a downlink transmission, the reader transmits radio frequency (RF) field energy, and a passive transponder receives the RF field energy with an L-C resonance circuit formed by a resonance inductor L (also called antenna) and a resonance capacitor C; a rectifier circuit in the transponder converts an alternating current into a direct current to be used by internal circuitries of the transponder, and stores electrical energy obtained through rectification in a storage capacitor CL. Mostly, amplitude modulation (AM) is adopted as a modulation scheme for the information delivered by the reader to the transponder, that is, RF oscillation current signals with different amplitudes are used to represent the code "0" or "1" in digital transmission. The RF signal in the downlink transmission may include operational instructions, such as writing an identification (ID) code into the memory of the transponder. In such operation, the transponder first receives the RF signal, and then performs a demodulation operation, and finally carries out the operation of writing the ID code into the memory. The transponder responds to the reader with an uplink transmission. During the uplink transmission, the reader stops transmitting RF field energy, a state referred to as field-off; and the transponder is powered by the electrical energy stored in an energy-storage capacitor, that is, the transponder transmits its response to the reader through the antenna. In some international standard RFID communications protocols, such as the ISO 11784/11785 standard for animal identification, transponder's response may be modulated using a frequency shift keying (FSK) scheme, where code "0" and code "1" in information may be respectively represented by different signal frequencies.

A key performance requirement of RFID applications is the distance of communication, i.e., communication with high sensitivity. As far as the HDX communication is concerned, the key is to maintain oscillation of the L-C resonance circuit at the antenna end during the period when RF field is switched off. Provided that oscillation magnitude is sufficient as required by a reader's receiving sensitivity, the oscillation frequency of the L-C resonance circuit is determined by the data "0" and "1" being sent; the oscillation has to be maintained until the uplink of data is completed. In this communication mode, energy stored in the storage capacitor is mainly consumed by the oscillation maintenance circuit, while other circuit modules are in a sleep state, consuming very little electrical energy. Apparently, the design quality of oscillation maintenance circuit is one of the key techniques for passive HDX RFID transponders. An oscillation maintenance circuit that charges an L-C resonance circuit through an energy-storage capacitor instead of an external power supply significantly influences communication distance of the transponder.

FIG. 1 is a block diagram of a communication process of an HDX passive RFID transponder. The oscillation maintenance circuit shown in the figure is one of the key elements. The application is an improvement on this circuit.

An existing solution for the oscillation maintenance circuit is disclosed in U.S. Pat. No. 6,806,738 by Texas Instruments, which proposed a complex peak detection circuit to monitor peak value of the alternating current oscillation magnitude when RF field is off. When the detected peak of alternating current oscillation magnitude is lower than a pre-determined threshold, an oscillation maintenance circuit controls related circuitry to inject electrical charges stored in a storage capacitor into the L-C resonance circuit, so that the resonance circuit continues to oscillate while maintaining a certain level of oscillating amplitude. As shown in FIG. 2, a current pulse is generated just at the point of time when the peak value of an RF signal is lower than the pre-determined threshold. This method is referred to as "plucking (fast injection)".

An advantage of the fast injection is that the oscillation maintenance circuit has very high efficiency. When the resonance circuit requires energy, the oscillation maintenance circuit injects a current into the resonance inductor, and maintains oscillation with high-energy current pulses. However, it has the following two disadvantages:

First, the signal processing process is complicated, which results in a complicated circuit structure whose implementation requires a lot of analog circuitries. Those analog circuitries themselves consume a lot of energy in the energy-storage capacitor, which in turn limits the usage of the fast injection method.

Second, the frequency of the injected current pulses is determined by the decaying characteristic of the oscillation magnitude of the resonance circuit, and is significantly different from the resonance frequency of the resonance circuit without correlation. Therefore, during uplink, there is a frequency shift on the oscillating signals at the antenna end, causing difficulty for the reader to receive and demodulate uplinked signals.

Another existing solution of the oscillation maintenance circuit is disclosed in U.S. Pat. No. 7,667,548 by Texas Instruments, which employed an end-of-burst (EOB) detection circuit. When an end of burst of a reader is detected, the EOB detection circuit generates an enable signal that in turn controls the oscillation maintenance circuit to continue to operate. In this solution, the oscillation maintenance circuit comprises a clock generation circuit, a programmable memory, an AND gate circuit, a current-limiting resistor, and a switch, etc. The clock generation circuit extracts a clock signal out of the RF field signal, and a combinational logic operation is performed between the clock signal and the "0" and "1" bit stream of the data being transmitted. In such a way, a current injection switch is turned on and off, and a current is smoothly injected into an L-C resonant circuit. Further, the current injection occurs in a negative half-period of the RF signal, and the injected current is a varying current without a fixed value. The injected current is limited by the current-limiting resistor R, and is related to an intrinsic quality factor of the resonance circuit, and therefore needs to be designed and controlled carefully. Further, a plurality of branches comprising of series connected current-limiting resistor R and current injection switch can be used to calibrate the resistance deviations due to manufacturing process deviations.

Advantages of this method are that the current can be smoothly injected, without causing a frequency drift of the RF response signal generated by the resonance circuit, and that circuit structure is simpler than that of the first solution and is easy to implement. However, there are disadvantages as follows:

First, the efficiency is low. Current injection occurs in the entire negative half-period of the RF signal, and takes a longer time than with current pulses, and therefore current consumption is high.

Second, the amount of the injected current in this method is closely related to quality factor of the resonance circuit. Therefore, the current-limiting resistor R needs to be designed carefully. The circuit uses a plurality of current injection branches controlled by switches, and it is a complicated process to select and control a current injection branch.

A third existing solution is disclosed in U.S. Pat. No. 8,629,759 by Texas Instruments. In this solution, modifications are made based on the previous two solutions. Firstly, regarding the problem of frequency drift in the first solution, a phase-locked loop (PLL) consisted of a loop filter, a phase and frequency detector, a voltage-controlled oscillator, and a multiplexer is adopted to stabilize the signal frequency. Secondly, to address the issue of efficiency in the second solution, a pulse width control method is proposed (that is, current is injected into resonance circuit in every half period, and a duration of current injection may be controlled accordingly). With the combination of the two modifications, a method to generate an injection control pulse signal of a stable frequency and a controllable pulse width to control the "plucking" current can be obtained. This solution works well and resolves the current injection efficiency problem and the frequency drift problem.

However, the third solution does not provide a method to control the pulse width. In addition, a PLL circuit for stabilizing control signal's frequency causes even larger power consumption of the transponder. Thus, the overall performance of the transponder is decreased.

SUMMARY

To improve the efficiency of oscillation maintenance circuits of HDX passive RFID transponders, the present disclosure provides a technical solution of an easy-to-implement oscillation maintenance circuit with a fixed pulse injection time duration. The disclosed circuit features simple structure, low power consumption, and relatively high efficiency, and prevents the problem of frequency drift of the oscillating signal at the antenna ends of HDX passive RFID transponders caused by current injection of oscillation maintenance circuits To achieve the foregoing objectives, the present disclosure provides a half-duplex RFID oscillation maintenance circuit with comparator-based pulse generation, including: a resonance inductor and a resonance capacitor connected in parallel between a first antenna end and a second antenna end, where the resonance inductor and the resonance capacitor form a resonance circuit that is coupled to an external radio frequency field to generate an alternating current, and inputs the alternating current to a rectifier circuit. An output end of the rectifier circuit is connected to an energy-storage capacitor and an internal circuit. The first antenna end and the second antenna end are connected to an end-of-burst (EOB) detection circuit, an output end of end-of-burst detection circuit is connected to a control end of a pulse generation circuit, so as to detect an RF signal of the first antenna end and the second antenna end and to control an operation state of the pulse generation circuit according to the RF signal.

The first antenna end and the second antenna end are connected to input ends of a clock recovery circuit, respectively, and an output end of the clock recovery circuit is connected to an input of the pulse generation circuit. The clock recovery circuit is configured to sample the RF signal to output a clock signal of the same frequency as the RF signal, as a clock for digital circuitry, and to control the pulse generation circuit to generate a pulse signal of the same frequency as the RF signal.

An input end of the pulse generation circuit is connected to the output end of the clock recovery circuit, the control end of the pulse generation circuit is connected to the output end of the end-of-burst detection circuit, which is connected to a level shifter circuit, so as to convert the clock signal to a high-voltage-level pulse signal of same frequency as the RF signal and with a fixed pulse width. A power end of the level shifter circuit is connected to the first antenna end through a switch unit and a current-limiting resistor connected in series, and an output end of the level shifter is connected to a control end of the switch unit, so as to convert the high-voltage-level pulse signal generated by the pulse generation circuit into a pulse signal at a same voltage level as an output voltage of the rectifier circuit, such that the pulse signal is inputted to the switch unit to control ON/OFF of the switch unit, so as to form a current injection loop from the energy-storage capacitor to the resonance circuit formed by the resonance inductor and the resonance capacitor Further, the pulse generation circuit includes a first current source, a second current source, a third P-type MOS transistor, a third N-type MOS transistor, a first capacitor, a first resistor, a second resistor, a first comparator, a second comparator, a first OR gate circuit, a second OR gate circuit, a third OR gate circuit, and an inverter.

The first current source and the second current source are respectively connected to the power supply, and an output end of the first current source is connected to a source electrode of the third P-type MOS transistor, and a gate electrode of the third P-type MOS transistor is connected to a source electrode of the third N-type MOS transistor and is also connected to the output end of the clock recovery circuit, and a drain electrode of the third P-type MOS transistor is connected to a drain electrode of the third N-type MOS transistor, and the source electrode of the third N-type MOS transistor is grounded, and the drain electrode of the third P-type MOS transistor is connected to negative input ends of the first comparator and the second comparator respectively and grounded through the first capacitor.

An output end of the second current source is grounded through the second resistor and the first resistor that are connected in series, and is also connected to a positive input end of the second comparator, and an output end of the second resistor is connected to a positive input end of the first comparator, and an output end of the first comparator is connected to a first input end of the first OR gate circuit, and a second input end of the first OR gate circuit is connected to the output end of the clock recovery circuit, and an output end of the first OR gate circuit is connected to a first input end of the third OR gate circuit.

An output end of the second comparator is connected to a first input end of the second OR gate circuit, and a second input end of the second OR gate circuit is connected to the output end of the clock recovery circuit, and an output end of the second OR gate circuit is connected to a second input end of the third OR gate circuit through the inverter, and an output end of the third OR gate circuit is connected to the level shifter circuit.

The control ends of the first current source, the second current source, the first comparator, and the second comparator are respectively connected to the output end of the end-of-burst detection circuit.

Further, the first comparator detects a positive end voltage of the first capacitor and compares the positive end voltage with a first reference voltage level to obtain a first output pulse signal, and simultaneously, the second comparator detects the positive end voltage of the first capacitor and compares the positive end voltage with a second reference voltage level to obtain a second output pulse signal and, after a logical operation is performed on the first output pulse signal and the second output pulse signal, a pulse signal with a fixed width is outputted to the level shifter circuit.

Advantages of the present disclosure using the foregoing structure include followings:

First, in the present disclosure, two comparators are used to respectively compare with two reference voltage levels to obtain an output pulse signal, and the reference voltage levels can be adjusted according to practical requirements, so that the switch-on point of time and current injection time duration are adjustable, maximizing the efficiency of current injection, resulting in simple circuit structure, low power consumption, and increased communication distance of an HDX passive RFID transponder.

Second, in the present disclosure, by sampling an RF signal and controlling a pulse generation circuit to generate a pulse signal of the same frequency as the RF signal, it may control a switch unit to be ON/OFF at a same frequency as the RF signal, achieving synchronization between change of the current injection and the RF signal. Thus, the oscillation frequency is not affected by current injection, ensuring the FSK communication performance in RFID applications.

DETAILED DESCRIPTION

The following describes the technical solutions in the embodiments of the present disclosure with reference to the accompanying drawings. Apparently, the described embodiments are merely some but not all of the embodiments of the present disclosure. Other embodiments obtained by a person of ordinary skill in the art based on the embodiments of the present disclosure without creative efforts shall fall within the protection scope of the present disclosure.

Figure 1:
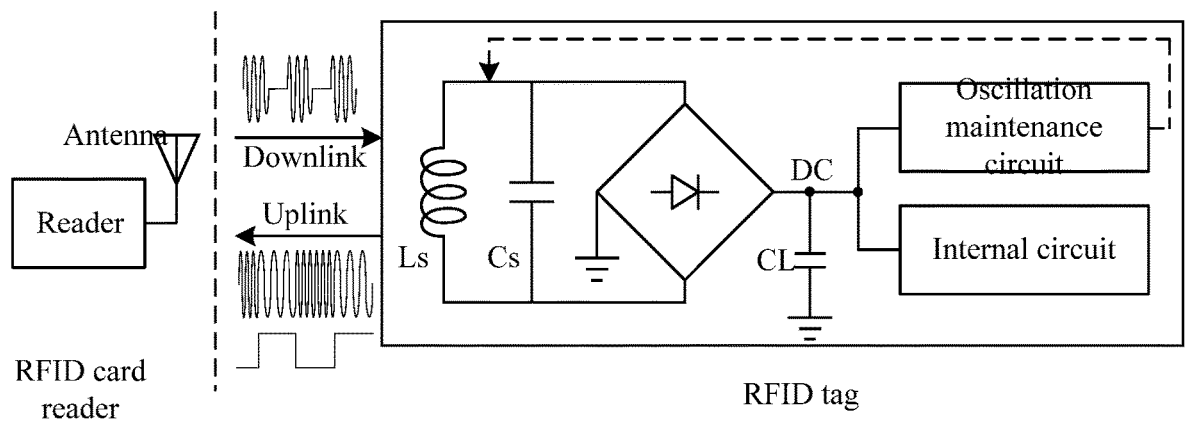
FIG. 1 is a block diagram of an HDX communication process between a reader and an HDX passive RFID transponder.
Figure 2:
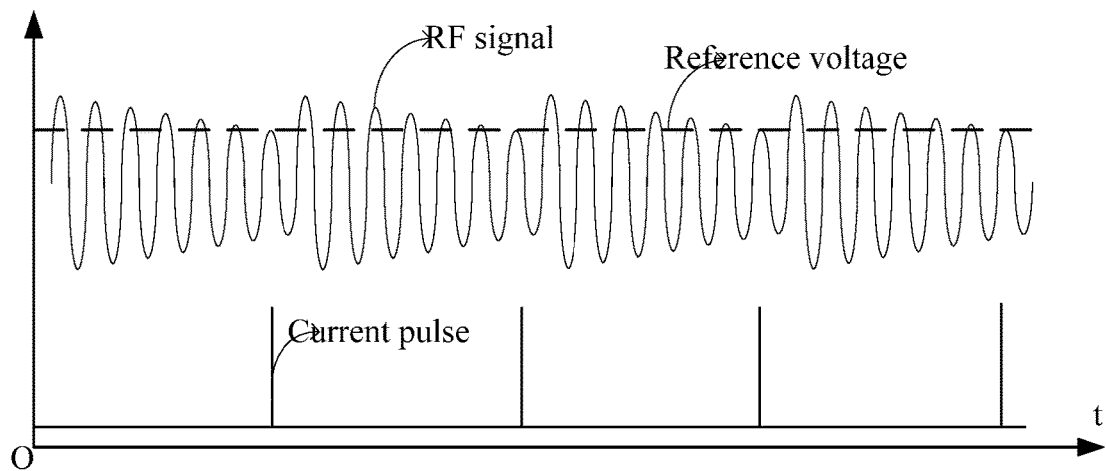
FIG. 2 is an illustration of signal waveforms of current injection of the oscillation maintenance circuit.
Figure 3:
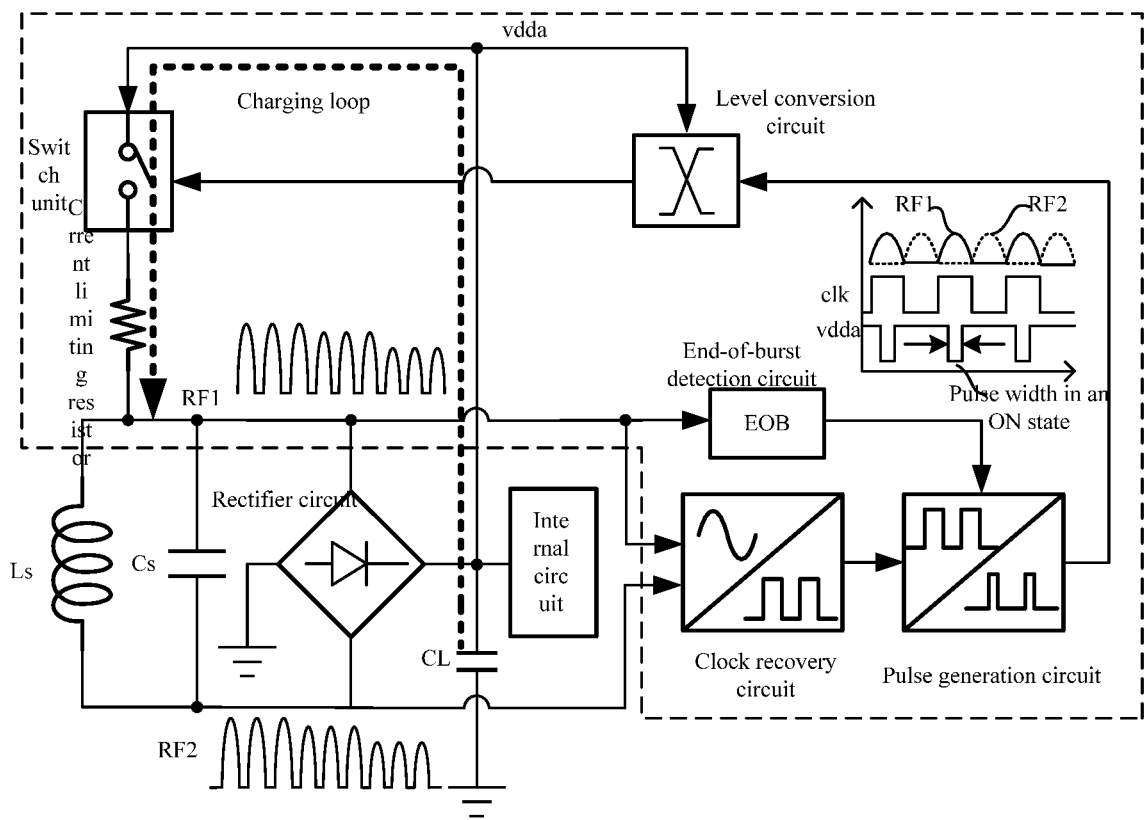
FIG. 3 is a schematic diagram of an oscillation maintenance circuit system according to the present disclosure.

FIG. 3 is a schematic diagram of an oscillation maintenance circuit with comparator-based pulse generation within an HDX passive RFID transponder according to the present disclosure. As shown in FIG. 3, the circuit includes a resonance inductor and a resonance capacitor that are connected in parallel between a first antenna end and a second antenna end. The resonance inductor and the resonance capacitor are configured to form an L-C resonance circuit, so that the L-C resonance circuit can receive external electromagnetic field to generate an alternating current, and input the alternating current to a rectifier circuit. An output end of the rectifier circuit is connected to an energy-storage capacitor and an internal circuit. The first antenna end and the second antenna end are connected to an end-of-burst (EOB) detection circuit (for the purpose of clarity of illustration, connection between the second antenna end and the EOB detection circuit is omitted in the drawings). An output end of the EOB detection circuit is connected to a control end of a pulse generation circuit and is used to detect RF signals of the first antenna end and the second antenna end, and to control the operation state of the pulse generation circuit according to the RF signals.

The first antenna end and the second antenna end are respectively connected to input ends of a clock recovery circuit. An output end of the clock recovery circuit is connected to an input end of the pulse generation circuit and is configured to sample the RF signal, and outputs a clock signal of the same frequency as the RF signal, which serves as the operation clock for the digital circuitry of the RFID transponder, and also controls the pulse generation circuit to generate a pulse signal of the same frequency as the RF signal. The first antenna end and the second antenna end are respectively connected to input ends of a clock recovery circuit. An output end of the clock recovery circuit is connected to an input end of the pulse generation circuit and is configured to sample the RF signal, and outputs a clock signal of the same frequency as the RF signal, which serves as the operation clock for the digital circuitry of the RFID transponder, and also controls the pulse generation circuit to generate a pulse signal of the same frequency as the RF signal.

The input end of the pulse generation circuit is connected to the output end of the clock recovery circuit, the control end is connected to the output end of the EOB detection circuit, and the output end is connected to a level shifter circuit. The pulse generation circuit is configured to convert the clock signal into a pulse signal having the same frequency as the RF signal at the antenna ends with a fixed pulse width.

The power end of the level shifter circuit is connected to the first antenna end through a switch unit and a current-limiting resistor that are connected in series. An output end of the level-shifter circuit is connected to a control end of the switch unit and level-shifter circuit is configured to convert a high voltage level pulse signal generated by the pulse generation circuit into a signal of a same voltage level as the rectifier's output voltage vdda, and to input the signal to the switch unit to control ON/OFF state of the switch unit, so that a current injection loop from the energy-storage capacitor to the resonance circuit including Ls and Cs is formed.

As efficiency of current injection of an oscillation maintenance circuit can be improved by reducing current injection time and by increasing the injected current. The oscillation maintenance circuit in the present disclosure provides a highly efficient current injection technique to achieve the objective of maintaining oscillation in the HDX passive RFID transponder by sampling the RF signal to obtain a narrow pulse signal of the same frequency as the RF signal, with a fixed pulse width and fixed injection point of time which is used to control the switch unit to be ON/OFF. Because the current injection frequency is the same as the RF signal frequency, there is no frequency drift problem at the antenna of the RFID transponder. Different from the existing solutions, the present disclosure adopts two comparators that are respectively compared with two reference voltage levels to obtain an output pulse signal, and the reference voltage levels can be adjusted according to practical requirements, so that the switch-on point of time and current injection time duration are adjustable, maximizing the efficiency of current injection. This disclosure features simple circuit structure and low power consumption, and effectively increases communication distance of an HDX passive RFID transponder.

The switch unit is configured to control the ON/OFF of the current injection loop at the same frequency as the RF signal frequency, which effectively injects charges from the energy-storage capacitor into the resonance circuit formed by Ls and Cs at the frequency of the pulse signal. In this way, the frequency drift problem of the existing solution can be eliminated. The switch unit may be a switch device, a compound switch, or a switch-type component, and OFF/ON of the switch is controlled by the pulse generation circuit.

Figure 4:
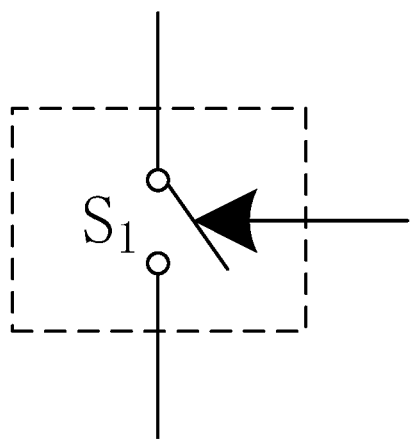
FIG. 4 is a structural diagram of a switch unit of an oscillation maintenance circuit according to an embodiment of the present disclosure.

As shown in FIG. 4, when the switch unit is a first switch S1, where an input end of the first switch is connected to the current-limiting resistor, and a power end of the first switch is connected to a power supply vdda, and a control end of the first switch is connected to the output end of the level shifter circuit.

Figure 5:
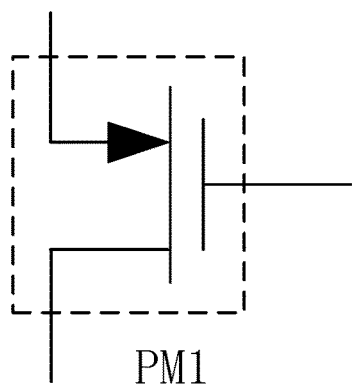
FIG. 5 is a structural diagram of a switch unit of an oscillation maintenance circuit according to another embodiment of the present disclosure.

When the switch unit is a first P-type MOS transistor PM1, a source electrode of the first P-type MOS transistor PM1 is connected to the power supply vdda, as a power end of the switch unit S1, and a drain electrode of the first P-type MOS transistor PM1 is connected to the current-limiting resistor, as the input of the switch unit S1, and a gate electrode of the first P-type MOS transistor PM1 is connected to the output end of the level shifter circuit as the control end of the switch unit, as shown in FIG. 5.

An input end of the EOB detection circuit is connected to the first antenna end and the second antenna end, and the output end of the EOB detection circuit is connected to the control end of the pulse generation circuit. The EOB detection circuit detects an RF signal with the input end. At the end of burst of RF field, the RF signal magnitude is attenuated rapidly. The EOB circuit detects the change of the RF signal magnitude, and outputs a logic signal whose voltage is maintained at a pre-defined level as an indication that the RF field from a reader device is off. Only when the EOB output signal voltage is at the pre-defined level, does the pulse generation circuit start to operate.

The clock recovery circuit is used to sample the RF signal, and output a clock signal of the same frequency as the RF signal to the pulse generation circuit. The clock signal, on one hand, serves as a clock for the operation of the digital circuitry part of the transponder (not shown in FIG. 3) and, on the other hand, is used by the pulse generation circuit. The input to the pulse generation circuit can also be taken from other circuit implementations, such as a current comparator, or a voltage comparator, etc., which extracts the input signal from the RF signal.

Figure 6:
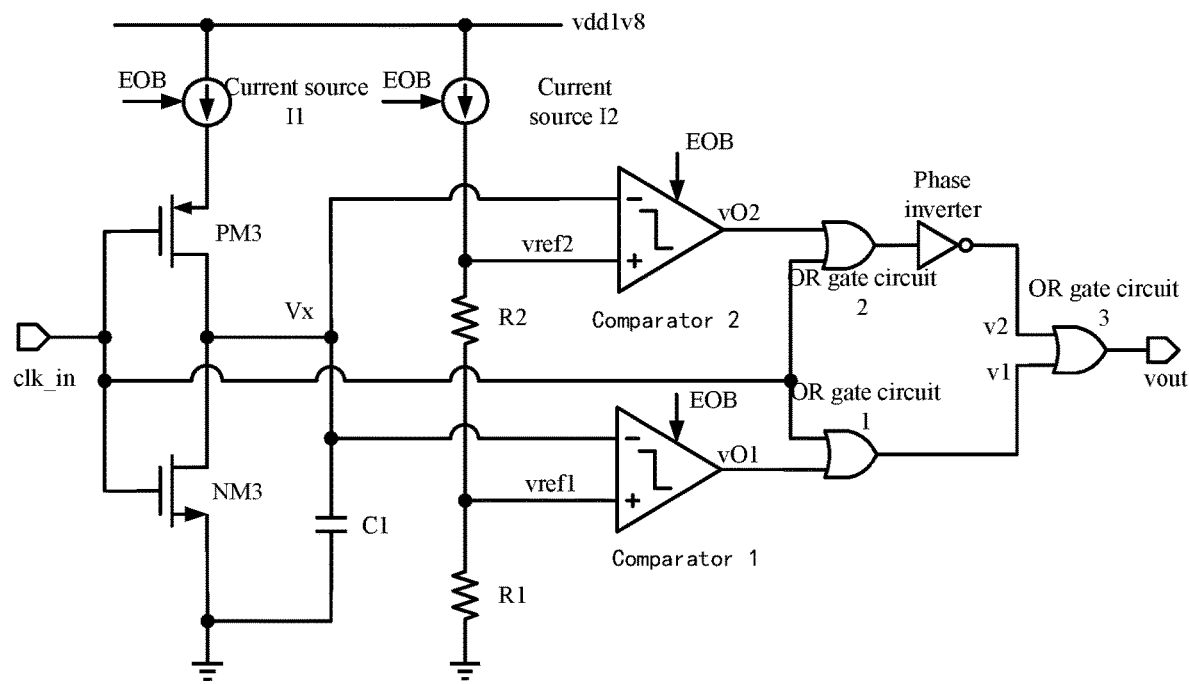
FIG. 6 is a structural diagram of a pulse generation unit according to the present disclosure.

FIG. 6 is a structural diagram of a pulse generation circuit according to the present disclosure. The pulse generation circuit includes a first current source I1, a second current source I2, a third P-type MOS transistor PM3, a third N-type MOS transistor NM3, a first capacitor C1, a first resistor R1, a second resistor R2, a first comparator, a second comparator, a first OR gate circuit, a second OR gate circuit, a third OR gate circuit, and an inverter.

The first current source I1 and the second current source I2 are respectively connected to a power supply (e.g., the power supply is an internally regulated 1.8Vvdd power supply), and an output end of the first current source I1 is connected to the source electrode of the third P-type MOS transistor PM3, and the gate electrode of the third P-type MOS transistor PM3 is connected to the source electrode of the third N-type MOS transistor NM3, and is connected to the output end of the clock recovery circuit. The drain electrode of the third P-type MOS transistor PM3 is connected to the drain electrode of the third N-type MOS transistor NM3, and the source electrode of the third N-type MOS transistor NM3 is grounded. the drain electrode of the third P-type MOS transistor PM3 is connected to negative input ends of the first comparator and the second comparator respectively, and is grounded through the first capacitor C1.

An output end of the second current source I2 is grounded through the second resistor R2 and the first resistor R1 that are connected in series. The output end of the second current source I2 is connected to a positive input end of the second comparator, and an output end of the second resistor R2 is connected to a positive input end of the first comparator. An output end of the first comparator is connected to a first input end of the first OR gate circuit, and a second input end of the first OR gate circuit is connected to the output end of the clock recovery circuit, and an output end of the first OR gate circuit is connected to a first input end of the third OR gate circuit.

An output end of the second comparator is connected to a first input end of the second OR gate circuit, and a second input end of the second OR gate circuit is connected to the output end of the clock recovery circuit. An output end of the second OR gate circuit is connected to a second input end of the third OR gate circuit through the inverter, and an output end of the third OR gate circuit is connected to the level shifter circuit.

The control ends of the first current source I1, the second current source I2, the first comparator, and the second comparator are respectively connected to the output end of the EOB detection circuit.

Figure 7:
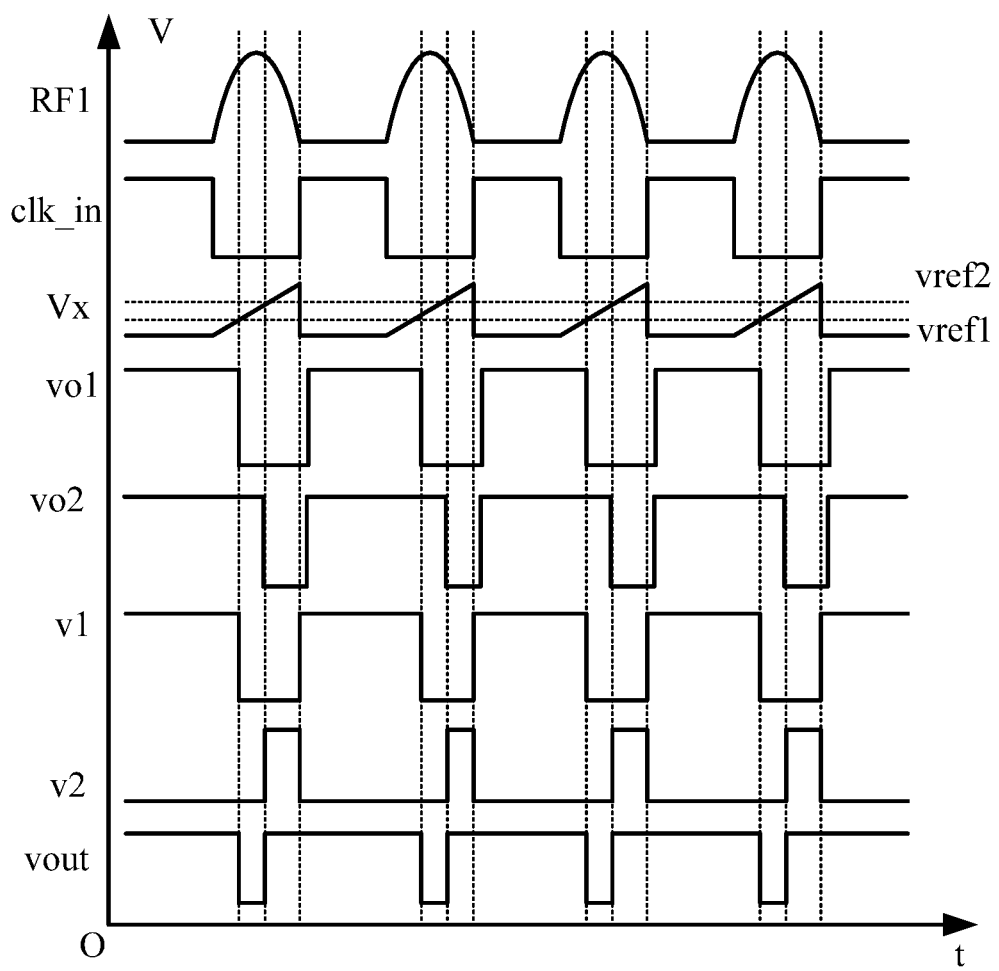
FIG. 7 is a graph of signal waveform of oscillation maintenance circuit according to the present disclosure.

As shown in FIG. 7, the input of the pulse generation circuit is a clock signal clk_in. When clk_in is at high voltage level, the third N-type MOS transistor NM3 is turned on, the third P-type MOS transistor PM3 is turned off, and the voltage of Vx node is pulled down to zero rapidly. When clk_in is at low voltage level, the third N-type MOS transistor NM3 is turned off, the third P-type MOS transistor PM3 is turned on, and the first current source I1 charges the first capacitor C1, and the voltage of Vx node ramps up with time at the slope valued I1/C1. In addition, the first comparator and the second comparator sample the change of the Vx node voltage, and compare the Vx node voltage with two reference voltage levels vref1 and vref2, respectively, where the reference voltage levels vref1 and vref2 are generated from a voltage division by means of the second current source I2 flowing through the first resistor R1 and the second resistor R2, which are connected in series.

Because the first resistor R1 and the second resistor R2 are both variable resistors, or variable resistive voltage-division units, values of the first reference voltage level vref1 and the second reference voltage level vref2 may be adjusted by adjusting resistance values of the first resistor R1 and the second resistor R2. In this way, the switch-on point of time of the switch unit and current injection time duration are adjusted, and efficiency of current injection can be maximized.

The first current source I1 and the second current source I2 may be implemented with PMOS current mirrors. A matching technique of current mirror layouts may be used to ensure the branch currents of the two current sources to have a proportional relationship, so that the impact of temperature variation and manufacturing process variation is reduced.

FIG. 7 shows signal voltage waveforms of selected nodes when the circuit is in a normal operation state. The clock recovery circuit samples the RF signal, and outputs a clock signal clk_in of the same frequency as the RF signal to the pulse generation circuit. The first comparator of the pulse generation circuit samples the voltage of the Vx node, and compares the voltage with the first reference voltage level vref1 to obtain a first output pulse signal vo1. The second comparator, at the same time, samples the voltage of the Vx node, and compares the voltage with the second reference voltage level vref2 to obtain a second output pulse signal vo2. Having an OR logic operation performed on the first output pulse signal vo1 and the clock signal clk_in, an output signal v1 is obtained. Having an OR logic operation performed on the second output pulse signal vo2 and the clock signal clk_in, an output signal v2 is obtained. Then, an OR logic operation is performed on v1 and v2, and a narrow pulse signal vout may be obtained.

Because the pulse generation circuit is powered by the power supply generated by a power management module, and the switch unit or the like is powered by the output power generated by the rectifier circuit, and also because the logic high voltage of the switch unit output must be the same voltage as the supply voltage generated by the rectifier circuit, there is a level shifter circuit connected between the output end of the pulse generation circuit and the switch unit. Due to its simple structure, the level shifter circuit may also be made as part of the pulse generation circuit or other control modules. The voltage of the signal vout is first level shifted, and then is used to control ON/OFF of the switch unit shown in FIG. 3. When vout is at low voltage level, the switch unit of the oscillation maintenance circuit is ON, and the energy-storage capacitor $C_L$ injects a current into the resonance circuit formed by Ls and Cs to maintain circuit oscillations. The reference voltage levels may be adjusted according to practical requirements, so that the switch-on point of time and current injection time duration are adjustable, thus maximizing efficiency of current injection. Because the signal vout has the same frequency as the RF signal, the switch unit turns ON and OFF at the same frequency as the RF signal, and the current injection is at the same frequency as the RF signal. Therefore, the frequency drift problem due to current injection in existing solutions is resolved effectively, and communication performance of the frequency shift keying modulation in an HDX passive RFID transponder application is ensured.

What is claimed is:

1. A half-duplex RFID oscillation maintenance circuit with comparator-based pulse generation, comprising:
    a resonance inductor and a resonance capacitor connected in parallel between a first antenna end and a second antenna end, different from the first antenna end, wherein the resonance inductor and the resonance capacitor form a resonance circuit that is coupled to an external radio frequency field to generate an alternating current, and inputs the alternating current to a rectifier circuit;
    wherein an output end of the rectifier circuit is connected to an energy-storage capacitor and an internal circuit;
    wherein the first antenna end and the second antenna end are connected to an end-of-burst detection circuit, an output end of end-of-burst detection circuit is connected to a control end of a pulse generation circuit, so as to detect an RF signal of the first antenna end and the second antenna end and to control an operation state of the pulse generation circuit according to the RF signal;
    wherein the first antenna end and the second antenna end are connected to input ends of a clock recovery circuit, respectively, and an output end of the clock recovery circuit is connected to an input of the pulse generation circuit;
    wherein the clock recovery circuit is configured to sample the RF signal to output a clock signal of the same frequency as the RF signal, as a clock for digital circuitry, and to control the pulse generation circuit to generate a pulse signal of the same frequency as the RF signal;
    wherein an input end of the pulse generation circuit is connected to the output end of the clock recovery circuit, the control end of the pulse generation circuit is connected to the output end of the end-of-burst detection circuit, which is connected to a level shifter circuit, so as to convert the clock signal to a high-voltage-level pulse signal of same frequency as the RF signal and with a fixed pulse width; and
    wherein a power end of the level shifter circuit is connected to the first antenna end through a switch unit and a current-limiting resistor connected in series, and an output end of the level shifter is connected to a control end of the switch unit, so as to convert the high-voltage-level pulse signal generated by the pulse generation circuit into a pulse signal at a same voltage level as an output voltage of the rectifier circuit, such that the pulse signal is inputted to the switch unit to control ON/OFF of the switch unit, so as to form a current injection loop from the energy-storage capacitor to the resonance circuit formed by the resonance inductor and the resonance capacitor, and
    wherein the pulse generation circuit includes two comparators being used to respectively compare with two reference voltage levels to obtain the high-voltage-level pulse signal, and the reference voltage levels are adjustable, such that a switch-on point of time and a current injection time duration of the switch unit are adjustable.

2. The oscillation maintenance circuit according to claim 1, wherein:
    the switch unit is a first switch;

an input end of the first switch is connected to the current-limiting resistor;
a power end of the first switch is connected to a power supply; and
a control end of the first switch is connected to an output end of the level shifter circuit.

3. The oscillation maintenance circuit according to claim 1, wherein:
the switch unit is a first P-type MOS transistor;
a source electrode of the first P-type MOS transistor is connected to a power supply and used as a power end of the switch unit;
a drain electrode of the first P-type MOS transistor is connected to the current-limiting resistor and used as an input end of the switch unit; and
a gate electrode of the first P-type MOS transistor is connected to an output end of the level shifter circuit and used as a control end of the switch unit.

4. The oscillation maintenance circuit according to claim 1, wherein the clock recovery circuit is a current comparator or a voltage comparator.

5. A half-duplex RFID oscillation maintenance circuit with comparator-based pulse generation, comprising:
a resonance inductor and a resonance capacitor connected in parallel between a first antenna end and a second antenna end, wherein the resonance inductor and the resonance capacitor form a resonance circuit that is coupled to an external radio frequency field to generate an alternating current, and inputs the alternating current to a rectifier circuit;
wherein an output end of the rectifier circuit is connected to an energy-storage capacitor and an internal circuit;
wherein the first antenna end and the second antenna end are connected to an end-of-burst detection circuit, an output end of end-of-burst detection circuit is connected to a control end of a pulse generation circuit, so as to detect an RF signal of the first antenna end and the second antenna end and to control an operation state of the pulse generation circuit according to the RF signal;
wherein the first antenna end and the second antenna end are connected to input ends of a clock recovery circuit, respectively, and an output end of the clock recovery circuit is connected to an input of the pulse generation circuit;
wherein the clock recovery circuit is configured to sample the RF signal to output a clock signal of the same frequency as the RF signal, as a clock for digital circuitry, and to control the pulse generation circuit to generate a pulse signal of the same frequency as the RF signal;
wherein an input end of the pulse generation circuit is connected to the output end of the clock recovery circuit, the control end of the pulse generation circuit is connected to the output end of the end-of-burst detection circuit, which is connected to a level shifter circuit, so as to convert the clock signal to a high-voltage-level pulse signal of same frequency as the RF signal and with a fixed pulse width; and
wherein a power end of the level shifter circuit is connected to the first antenna end through a switch unit and a current-limiting resistor connected in series, and an output end of the level shifter is connected to a control end of the switch unit, so as to convert the high-voltage-level pulse signal generated by the pulse generation circuit into a pulse signal at a same voltage level as an output voltage of the rectifier circuit, such that the pulse signal is inputted to the switch unit to control ON/OFF of the switch unit, so as to form a current injection loop from the energy-storage capacitor to the resonance circuit formed by the resonance inductor and the resonance capacitor,
wherein:
the pulse generation circuit comprises a first current source, a second current source, a third P-type MOS transistor, a third N-type MOS transistor, a first capacitor, a first resistor, a second resistor, a first comparator, a second comparator, a first OR gate circuit, a second OR gate circuit, a third OR gate circuit, and an inverter;
the first current source and the second current source are respectively connected to the power supply, and an output end of the first current source is connected to a source electrode of the third P-type MOS transistor, and a gate electrode of the third P-type MOS transistor is connected to a source electrode of the third N-type MOS transistor and is also connected to the output end of the clock recovery circuit, and a drain electrode of the third P-type MOS transistor is connected to a drain electrode of the third N-type MOS transistor, and the source electrode of the third N-type MOS transistor is grounded, and the drain electrode of the third P-type MOS transistor is connected to negative input ends of the first comparator and the second comparator respectively and grounded through the first capacitor;
an output end of the second current source is grounded through the second resistor and the first resistor that are connected in series, and is also connected to a positive input end of the second comparator, and an output end of the second resistor is connected to a positive input end of the first comparator, and an output end of the first comparator is connected to a first input end of the first OR gate circuit, and a second input end of the first OR gate circuit is connected to the output end of the clock recovery circuit, and an output end of the first OR gate circuit is connected to a first input end of the third OR gate circuit;
an output end of the second comparator is connected to a first input end of the second OR gate circuit, and a second input end of the second OR gate circuit is connected to the output end of the clock recovery circuit, and an output end of the second OR gate circuit is connected to a second input end of the third OR gate circuit through the inverter, and an output end of the third OR gate circuit is connected to the level shifter circuit; and
control ends of the first current source, the second current source, the first comparator, and the second comparator are respectively connected to the output end of the end-of-burst detection circuit.

6. The oscillation maintenance circuit according to claim 5, wherein the first current source and the second current source are current mirror structures formed by P-type MOS transistors, with matching current mirror layouts, and branch currents of both current sources have a proportional relationship so that impact of temperature variation and manufacturing process variation is reduced.

7. The oscillation maintenance circuit according to claim 5, wherein:
the first comparator detects a positive end voltage of the first capacitor and compares the positive end voltage with a first reference voltage level to obtain a first output pulse signal, and simultaneously, the second comparator detects the positive end voltage of the first capacitor and compares the positive end voltage with a second reference voltage level to obtain a second output pulse signal; and after a logical operation is performed on the first output pulse signal and the second output pulse signal, a pulse signal with a fixed width is outputted to the level shifter circuit.

8. The oscillation maintenance circuit according to claim 5, wherein the first resistor and the second resistor are both variable resistors, and are configured to adjust voltage values of a first reference voltage level and a second reference voltage level.

9. The oscillation maintenance circuit according to claim 5, wherein the first resistor and the second resistor are both adjustable resistive voltage division units, and are configured to adjust voltage values of a first reference voltage and a second reference voltage level.

10. The oscillation maintenance circuit according to claim 1, wherein the switch unit turns ON/OFF at a same frequency as the pulse signal, and injects charges from the energy-storage capacitor into the resonance circuits formed by the resonance inductor and the resonance capacitor at a same frequency as the pulse signal, so as to prevent frequency drift during current injection.

* * * * *